United States Patent
Quinn et al.

(10) Patent No.: US 8,902,004 B2
(45) Date of Patent: Dec. 2, 2014

(54) REDUCING THE EFFECT OF PARASITIC MISMATCH AT AMPLIFIER INPUTS

(71) Applicant: Xilinx, Inc., San Jose, CA (US)

(72) Inventors: Patrick J. Quinn, Dublin (IE); John K. Jennings, Dublin (IE); Darragh Walsh, Cork (IE); Padraig Kelly, Cork (IE)

(73) Assignee: Xilinx, Inc., San Jose, CA (US)

( * ) Notice: Subject to any disclaimer, the term of this patent is extended or adjusted under 35 U.S.C. 154(b) by 113 days.

(21) Appl. No.: 13/629,123

(22) Filed: Sep. 27, 2012

(65) Prior Publication Data

US 2014/0085003 A1 Mar. 27, 2014

(51) Int. Cl.
*H03F 3/45* (2006.01)

(52) U.S. Cl.
CPC .................................. *H03F 3/45* (2013.01)
USPC .................. 330/253; 330/68; 330/207 P

(58) Field of Classification Search
CPC .................................................. H03F 3/45
USPC ........................................ 330/68, 253, 207 P
See application file for complete search history.

(56) References Cited

U.S. PATENT DOCUMENTS

| | | | |
|---|---|---|---|
| 3,870,968 A * | 3/1975 | Vosteen et al. | 330/298 |
| 4,724,390 A | 2/1988 | Rauscher et al. | |
| 4,812,722 A | 3/1989 | Corrothers | |
| 6,784,824 B1 | 8/2004 | Quinn | |
| 7,994,609 B2 | 8/2011 | Quinn | |
| 2007/0215928 A1 | 9/2007 | McLeod | |

OTHER PUBLICATIONS

Mayosky, M. A. et al., Two-Electrode Biopotential Measurements: Power Line Interference Analysis:, IEEE Transactions on BioMedical Engineering, vol. 52, No. 8, Aug. 1, 2005, pp. 1436-1442. IEEE Service Center Piscataway, N.J., USA.

* cited by examiner

Primary Examiner — Robert Pascal
Assistant Examiner — Khiem Nguyen
(74) Attorney, Agent, or Firm — Kevin T. Cuenot; David Parandoosh

(57) ABSTRACT

A circuit includes an amplifier including a differential input stage including a first input terminal and a second input terminal. The circuit further includes a differential input line coupled to the first input terminal and the second input terminal, and shielding at least partially encompassing the differential input line. The shielding is connected to a node of the differential input stage of the amplifier.

18 Claims, 5 Drawing Sheets

REDUCING THE EFFECT OF PARASITIC MISMATCH AT AMPLIFIER INPUTS

FIELD OF THE INVENTION

One or more embodiments disclosed within this specification relate to integrated circuits (ICs) and, more particularly, to removing systematic parasitic mismatch at amplifier inputs within a circuit.

BACKGROUND

Switched capacitor circuits are used within a variety of different applications including, for example, analog-to-digital converters (ADCs) and/or other discrete time signal processing systems. In general, switched capacitor circuits operate by moving charges among capacitors within the circuit by opening and closing a set of switches. Switched capacitor technology enables circuits to achieve a high degree of accuracy. Like other circuits, however, switched capacitor circuits are vulnerable to parasitic capacitances. Parasitic capacitances are often found at the input(s) to an amplifier and, more particularly, between the input(s) of the amplifier and a static reference node.

SUMMARY

A circuit includes an amplifier having a differential input stage including a first input terminal and a second input terminal. The circuit further includes a differential input line coupled to the first input terminal and the second input terminal and shielding at least partially encompassing the differential input line. The shielding is connected to a node of the differential input stage of the amplifier.

A method includes providing an amplifier having a differential input stage including a first input terminal and a second input terminal and connecting a differential input line to the first input terminal and the second input terminal. Shielding is formed that at least partially encompasses the differential input line. The shielding is connected to a node of the differential input stage of the amplifier.

DETAILED DESCRIPTION OF THE DRAWINGS

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to integrated circuits (ICs) and, more particularly, to removing systematic parasitic mismatch at input(s) of an amplifier. In accordance with the inventive arrangements disclosed within this specification, the effects of parasitic capacitances present at the input of a differential amplifier can be reduced. Shielding that is applied to the differential input line connected to an input stage of the amplifier can be connected to an internal node of the amplifier rather than connecting the shielding to a reference node within the circuit. For example, the shielding can be coupled to a common source node of an input stage of the amplifier as opposed to ground or another reference node. By connecting the shielding to an internal node of the amplifier, effects of the parasitic capacitances at the input of the amplifier can be reduced substantially, thereby increasing the performance and accuracy of the circuit.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1A:
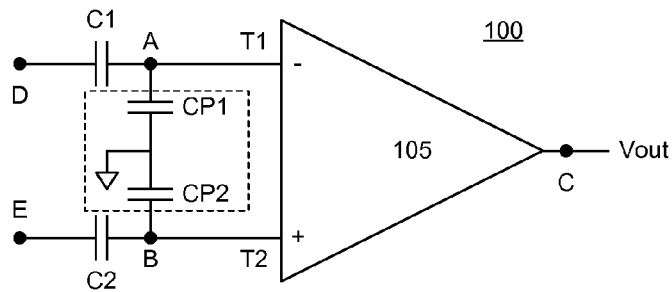
FIGS. 1A and 1B are diagrams that illustrate parasitic capacitances within different phases of a bi-phase circuit.
Figure 1B:
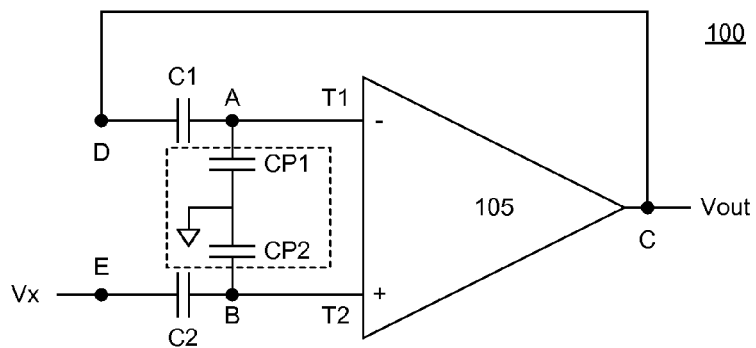

FIGS. 1A and 1B are diagrams that illustrate parasitic capacitances within different phases of a bi-phase circuit 100. Circuit 100 shown in FIGS. 1A and 1B includes switched capacitor technology. Regarding both of FIGS. 1A and 1B, circuit 100 includes an amplifier 105 having a differential input with input terminals T1 and T2 and an output at node C providing Vout. Capacitor C1 is connected to input terminal T1. Capacitor C2 is connected to input terminal T2. Capacitors CP1 and CP2, which are connected between node A and node B, represent parasitic capacitances. As such, CP1 and CP2 are not physical capacitors that are part of circuit 100. Rather, CP1 and CP2 are included for purposes of analysis and modeling of parasitic effects.

FIG. 1A illustrates a sample phase for circuit 100. FIG. 1B illustrates a hold phase for circuit 100. For purposes of clarity, the switches used to establish the configuration shown in FIG. 1A and the configuration shown in FIG. 1B and switch between the two phases for bi-phase operation are not shown. Appreciably, a "closed" switch indicates that the switch forms a conductive path, e.g., a short circuit, between two nodes of a circuit that are physically connected to the switch. An "open" switch disconnects the two nodes of the circuit physically connected to the switch from one another thereby creating an open circuit, e.g., no conductive path, between the two nodes.

During the sample phase illustrated in FIG. 1A, input signals are provided to each of nodes D and E charging capacitor C1 to a voltage of VC1 and capacitor C2 to a voltage of VC2. During the sample phase, an open switch (not shown) eliminates any feedback path between node C and node D. During the sample phase, amplifier 105 can be placed in a nonoperational state in which no output is generated at node C and/or the input signals received at input terminals T1 and T2 are not processed.

The differential input signal provided to nodes D and E within FIG. 1A can be any of a variety of different signal types. In one aspect, for example, the signal provided at node D is always at a higher level than the signal provided to node E. In another aspect, the differential input signal can be a bipolar signal in which the signal provided at node D can be higher or lower compared to the signal at node E.

During the hold phase illustrated in FIG. 1B, the differential input signal provided to nodes D and E is disconnected from each node. As illustrated, node C is connected to node D forming a feedback path. Further a fixed voltage denoted as Vx is connected to node E. The fixed voltage Vx can be a reference voltage, ground, or the like.

By providing suitable control signals to switches, circuit 100 can switch between implementing the sample phase of FIG. 1A and the hold phase of FIG. 1B. Circuit 100 can be used, or incorporated within, a variety of different circuits and/or systems. In one example, circuit 100 is used as, or incorporated within, a switched capacitor stage of an analog-to-digital converter (ADC).

For purposes of illustration, consider the case in which a voltage Vin is sampled on C1 in a sample phase and —Vin is sampled on C2 in a prior sample phase. With this operation in mind, the ideal transfer function of circuit 100 in the hold phase illustrated in FIG. 1B is defined below using expression 1.

$$V\text{out} = Vx + VC1 + VC2 = Vx + 2(V\text{in}) \qquad (1)$$

Parasitic capacitances CP1 and CP2 represent parasitic capacitances relating to the input of amplifier 105. CP1 is connected between input terminal T1 and ground. CP2 is connected between input terminal T2 and ground. When CP1 and CP2 are balanced, e.g., have equal capacitance values, the transfer function of circuit 100 remains ideal as illustrated in expression 1. In that case, with the capacitance values of CP1 and CP2 being equal, the influence of the parasitic capacitance serves only to reduce the settling time of circuit 100.

A loss of accuracy in circuit 100 does occur when capacitance values of capacitors C1 and C2 are mismatched (e.g., C1≠C2) and/or when the parasitic capacitances CP1 and CP2 are mismatched (CP1≠CP2). Consider the case of matched parasitic capacitances and mismatched capacitors (C1≠C2) illustrated in expression 2 below. From time to time within this specification C1 and C2 are referred to as "signal capacitors" since each is located in the signal path into amplifier 105. Within expression 2, for purposes of convenience, the value of Vx is assumed to be zero (0); ΔC=C1−C2; Cpar refers to the nominal value of a parasitic capacitor, e.g., the nominal value of CP1 or CP2; and C refers to the nominal value of a capacitor, e.g., either C1 or C2.

$$\frac{V\text{out}}{V\text{in}} = 2\left(1 + \frac{1}{2}\frac{C\text{par}}{C + C\text{par}} \cdot \frac{\Delta C}{C}\right) \qquad (2)$$

Expression 3 illustrates the case of mismatched parasitic capacitances. In expression 3, Vx is assumed to be zero (0), ΔCpar=CP1−CP2, and Cpar, as noted, refers to the nominal value of either CP1 or CP2.

$$\frac{V\text{out}}{V\text{in}} = 2\left(1 + \frac{1}{2}\frac{C\text{par}}{C + C\text{par}} \cdot \frac{\Delta C\text{par}}{C\text{par}}\right) \qquad (3)$$

How well the slope of an actual transfer function of a data converter (e.g., an ADC) matches the slope of the ideal transfer function is expressed or measured as the "Gain Error". Gain Error is usually expressed in Least Significant Bits (LSB) or as a percent of full-scale range. Gain Error is the full-scale error minus the offset error.

The Gain Error expressed by each of expressions 2 and 3 in the ADC stage translates directly into integral non-linearity (INL) error present at the ADC output. Based upon expressions 2 and 3, one can see that increased accuracy can be achieved by ensuring that Cpar remains much less than C (e.g., Cpar<<C).

Parasitic capacitance (Cpar) for CP1 or CP2 is formed of, and determined using, several components as shown below in expression 4.

$$C\text{par} = C\text{wire} + C\text{metal} + C_{gd} \qquad (4)$$

Within expression 4, Cwire represents the capacitance of a wiring terminal (i.e., T1 or T2 of amplifier 105 depending upon whether evaluating for CP1 or CP2), Cmetal represents the capacitance summed across the metallization for all fingers of a metal-oxide-semiconductor field-effect-transistor (MOSFET) between the gate and surrounding elements such as the drain for the relevant input terminal (i.e., either T1 or T2 depending upon whether evaluating for CP1 or CP2), and Cgd represents the gate-drain overlap capacitance for the sum of all fingers of the input MOSFET for the input terminal.

Referring to expression 4, Cwire typically dominates the components used in calculating Cpar. This is often the case since Cpar is predominantly composed of capacitance that exists with respect to the surrounding shielding. In conventional circuits, the shielding is coupled to ground or a reference node. Cmetal and Cgd are largely fixed and depend upon the size of the input stage of amplifier 105 and number of fingers used. In general, however, Cmetal and Cgd are well matched to their equivalents on the opposite input terminal of the amplifier due to the fact that the input devices are realized as modular, repeatable structures in which common-centroid techniques are employed.

For the reasons discussed above, mismatch in Cpar is dominated by the mismatch of Cwire. Matching the parasitic wiring capacitance on the input terminals T1 and T2 of amplifier 105 is difficult due to the length of the input lines connected to T1 and T2. The mismatch in Cwire is on the order of approximately 5 fF (femto-Farads). Cwire mismatch is further exacerbated by the fact that different operating environments exist on each side of the input lines to amplifier 105. The particular circuitry located on either side of the input lines is not usually symmetric.

Figure 2:
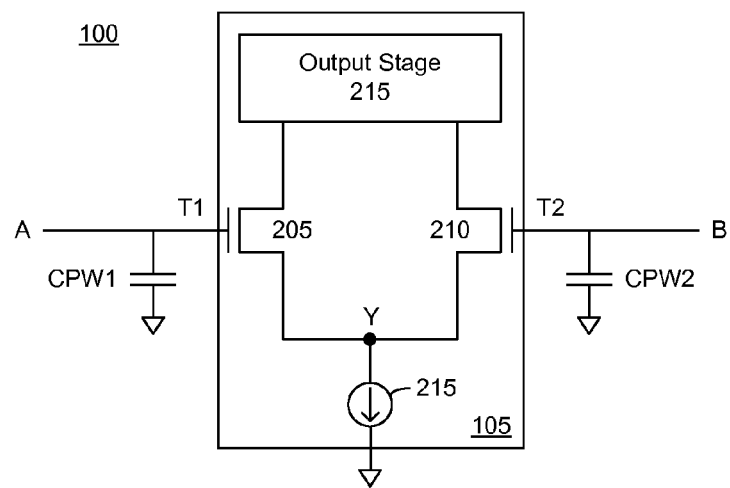
FIG. 2 is a diagram illustrating parasitic capacitances relating to the amplifier shown in FIG. 1.

FIG. 2 is a diagram illustrating parasitic capacitances relating to amplifier 105 of FIG. 1. FIG. 2 illustrates a more detailed view of the input stage, which includes transistors 205 and 210 forming a MOSFET differential pair within amplifier 105. The source of each of MOSFETs 205 and 210 is connected at node Y. As shown, a current source 215 is connected between node Y and ground. The remainder of amplifier 105 is illustrated as output stage 215.

Within FIG. 2, the parasitic capacitance from the wires (i.e., Cwire) is subdivided into a component associated with each of input terminals T1 and T2 and illustrated as CPW1 and CPW2. As discussed with reference to FIG. 1, parasitic capacitances represented by CPW1 and CPW2 are not actual capacitors within circuit 100, but rather are included for purposes of analysis and modeling. As pictured, CPW1 is connected between input terminal T1 and a static reference node. CPW2 is connected between input terminal T2 and a static reference node.

Figure 3:
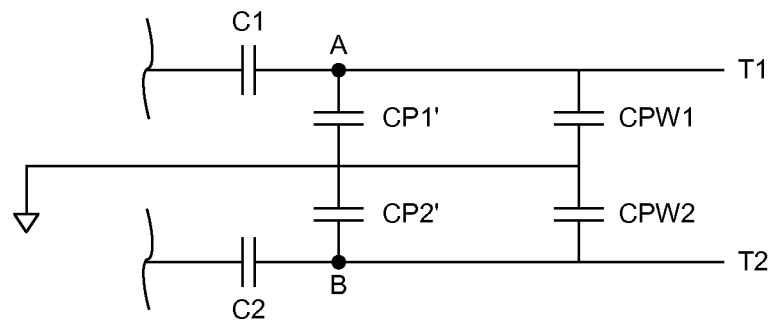
FIG. 3 is a diagram illustrating parasitic capacitances relating to the inputs of the amplifier of FIG. 1.

FIG. 3 is a diagram illustrating parasitic capacitances relating to the inputs of amplifier 105. FIG. 3 illustrates how the parasitic capacitance from the wires can be subdivided out from the parasitic capacitances previously described. As shown, CP1 is replaced with CP1'. Whereas CP1 represented the parasitic capacitance (Cpar) associated with input terminal T1 as the combination of the Cwire, Cmetal, and Cgd parasitic capacitance components, CP1' represents only the Cmetal and Cgd parasitic capacitance components associated with input terminal T1. CPW1 represents the Cwire parasitic capacitance component associated with input terminal T1 and is illustrated independently of CP1'. CP2 is replaced with CP2'. Whereas CP2 represented the parasitic capacitance (Cpar) associated with input terminal T2 as the combination of the Cwire, Cmetal, and Cgd parasitic capacitance components, CP2'represents only the Cmetal and Cgd parasitic capacitance components associated with input terminal T2. CPW2 represents the Cwire parasitic capacitance component associated with input terminal T2 and is illustrated independently of CP2'. As shown, each of CP1', CP2', CPW1, and CPW2 is coupled to ground in the model pictured in FIG. 3.

Figure 4:
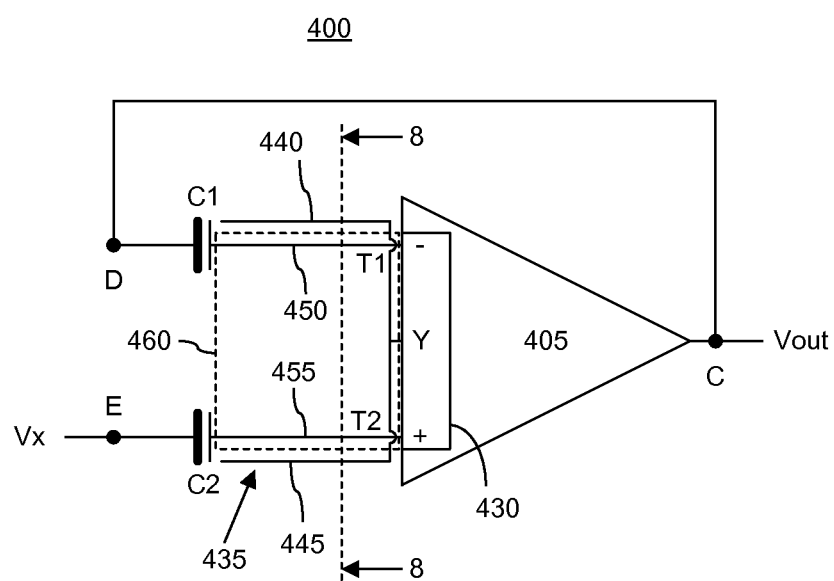
FIG. 4 is a diagram illustrating a circuit including shielding coupled to an internal node of an amplifier.

FIG. 4 is a diagram illustrating a circuit 400 including shielding coupled to an internal node of an amplifier. For purposes of illustration, parasitic capacitances are not represented in FIG. 4. In general, circuit 400 is substantially similar to circuit 100 of FIG. 1. Accordingly, circuit 400 includes an amplifier 405 and capacitors C1 and C2. While circuit 400 is configurable to implement bi-phase operation, e.g., a sample phase and a hold phase, only the hold phase is illustrated (similar to the hold phase of FIG. 1B).

Amplifier 405 includes a differential input stage 430 having differential inputs represented as input terminal T1 and input terminal T2. Input terminal T1 is connected to input line 450. Input terminal T2 is connected to input line 455. Input lines 450 and 455, taken collectively, form a differential input line 460. Differential input line 460 is illustrated in FIG. 4 as the portion of input line 450 between capacitor C1 and input terminal T1 and the portion of input line 455 between capacitor C2 and input terminal T2.

Circuit 400 includes shielding 435. Shielding 435 is configured to shield differential input line 460 formed of input lines 450 and 455. Shielding 435 can include a first portion 440 formed of one or more conductive elements that flank, e.g., are immediately adjacent to, input line 450 between capacitor C1 and input terminal T1. Shielding 435 includes a second portion 445 formed of one or more conductive elements that flank input line 455 between capacitor C2 and input terminal T2. Shielding 435 is substantially parallel to differential input line 460. For example, first portion 440 is substantially parallel with input line 450. Second portion 445 is substantially parallel with input line 455.

Each conductive element of shielding 435 can be formed of a conductor such as a wire, a via, or other portion of metal usable as or within a process layer of an IC manufacturing process, or a portion of metal traversing from one process layer to another. In one example, each conductive element can be formed of more than one wire, e.g., multiple metal layers coupled using vias that form a "wall". In another example, each conductive element can be formed of more than one via that at least partially encompasses a vertical signal connection. In either case, as shown in FIG. 4, shielding 435 at least partially encompasses the input lines 450 and 455 to amplifier 405.

As noted, in conventional circuits, shielding is tied to a reference node in the circuit. The reference node is typically ground, but can be a voltage supply (e.g., VCC). In circuit 400, shielding 435 is coupled to node Y within differential input stage 430 of amplifier 405. When shielding used in and around the input terminals to amplifier 405 is coupled to node Y, the effects from the parasitic wire capacitance represented by CPW1 and CPW2 are significantly reduced.

Figure 5:
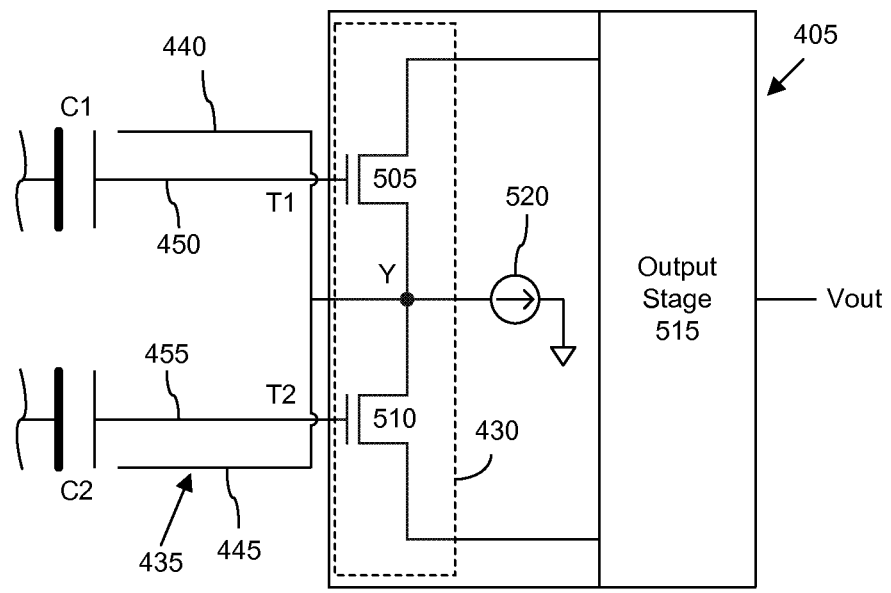
FIG. 5 is a diagram illustrating a portion of the circuit of FIG. 4.

Within FIGS. 4 and 5, capacitors C1 and C2 are illustrated with one plate being thicker than the other. When each of capacitors C1 and C2 is formed using one or more metal layers, the thicker plate represents the "bottom" plate and the thinner plate represents the "top" plate. As used herein with reference to plates of a capacitor, the "bottom" plate refers to the plate that is most parasitic, while the "top" plate refers to the plate that is less parasitic (as opposed to referring to the location of metal layers, for example). The bottom plate, being more parasitic, is typically the plate switched between low impedance nodes. The top plate, being less parasitic, is typically connected to the amplifier input.

In modern semiconductor IC manufacturing processes, capacitors are often created using a plurality of inter-digitated lines on the same metal layer. One set of digitated lines implements the bottom plate and the other set of digitated lines implements the top plate. The capacitance is formed predominantly by the sidewall capacitance between the lines. This construction can be repeated for a number of metal layers to increase the overall capacitance of the capacitor. For further illustration, see, for example, U.S. Pat. No. 7,994,609, which is fully incorporated herein by reference, and which illustrates formation of capacitive structures using inter-digitated lines.

FIG. 5 is a diagram illustrating a portion of circuit 400 of FIG. 4. FIG. 5 illustrates a more detailed view of input differential stage 430, which includes transistors 505 and 510 forming a MOSFET differential pair. The source of each of MOSFETs 505 and 510 is coupled at node Y. The drain of each of MOSFETs 505 and 510 is coupled to output stage 515. The gate of MOSFET 505 is connected to input terminal T1. The gate of MOSFET 510 is connected to input terminal T2. As shown, a current source 520 is coupled between node Y and ground. Shielding 435 is also coupled to node Y, which is a common source node, within differential input stage 430. The remainder of amplifier 405 is illustrated as output stage 515.

Figure 6:
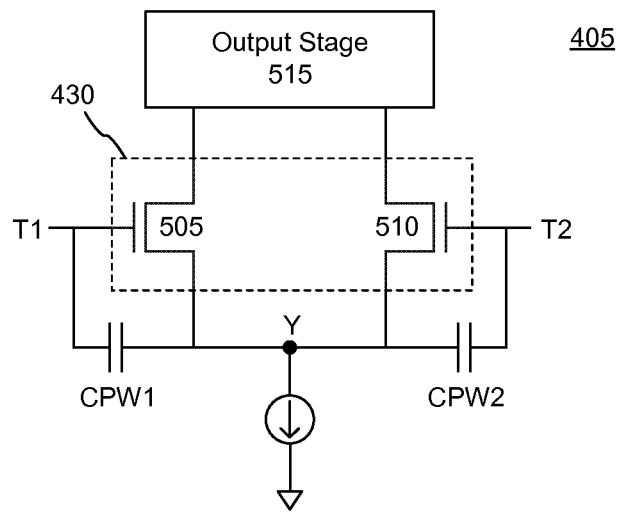
FIG. 6 is a diagram illustrating a portion of the circuit of FIG. 4 showing parasitic capacitances.

FIG. 6 is a diagram illustrating a portion of circuit 400 showing parasitic capacitances. As shown, amplifier 405 is pictured including MOSFETs 505 and 510 forming differential input stage 430. Differential input stage 430 is coupled to output stage 515. Further node Y of differential input stage 430 is coupled to current source 520. Parasitic capacitances and, more particularly, Cwire, as depicted by CPW1 and CPW2, is illustrated. With shielding 435 (not shown) coupled to node Y as described with reference to FIGS. 4 and 5, CPW1 is connected between input terminal T1 and node Y. CPW2 is connected between input terminal T2 and node Y.

FIG. 6 illustrates that the effects of CPW1 and CPW2 are substantially reduced. CPW1 and CPW2 are, in effect, placed in parallel with Cgs1 and Cgs2 of differential input stage 430. Cwire is effectively halved since the two parasitic capacitances CPW1 and CPW2 are in series between input terminal T1 and input terminal T2 of amplifier 405. Connecting shielding 435 to node Y also increases the feedback factor for amplifier 405 towards unity. Increasing the feedback factor, as described, results in a reduction in the settling time of amplifier 405, which is a further benefit of connecting shielding 435 to node Y.

Figure 7:
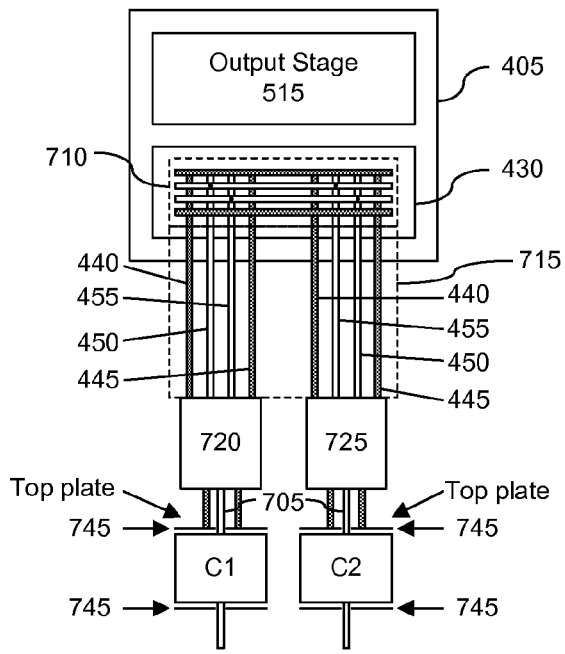
FIG. 7 is a layout view of a portion of the circuit of FIG. 4.

FIG. 7 is an exemplary implementation of circuit 400 shown in a layout view. As illustrated C1 and C2 are implemented in one or more metal layers using any of a variety of different capacitive element formation techniques. The top plate connections emanate out of the top side to the associated switches 720 and 725 for each respective capacitor C1 and C2. The combined width of C1 and C2 is laid out to correspond to, e.g., be substantially equivalent to, the width of differential input stage 430 of amplifier 405. In this way, short vertical connections 705 are implemented from each capacitor C1 and C2 to switches 720 and 725 respectively. As shown, vertical connections 705 are shielded. In one aspect, shielding for connections 705 can be implemented as, or part of, shielding 435 described below.

Within block 715, short vertical connections form signal lines 450 and 455 (differential input line 460) and shielding 435 formed of first portion 440 and second portion 445. The vertical connections connect switches 720 and 725 with differential input stage 430 and, more particularly, to a differential input pair bus 710, a portion of which is illustrated but is understood to extend to the left and to the right beyond what is viewable in FIG. 7. Differential input pair bus 710 is also shielded as shown. The shielding is connected to node Y (i.e., a common source node not shown) within differential input stage 430. Vertical segments in block 715 are substantially parallel with one another (e.g., differential input lines 460 are parallel with shielding) and extend vertically through process layers (perpendicular to process layer) and perpendicular to the differential input pair bus 710, which is horizontal and in the plane of process layers, e.g., metal layers.

The capacitor top plate connections to their switches can be completely encased by the bottom plate so that the top plate only ever sees the bottom plate. The dummy caps at the top and bottom side of the signal capacitors ensure uniformity of the environment of the signal capacitors to reduce the impact of large area effects such as chemical-mechanical polishing (CMP) and to keep the metal density controlled and uniform beyond the edges of the signal capacitors.

Coupling shielding 435 to node Y within amplifier 405 as described within this specification can significantly improve performance of an ADC utilizing a circuit such as circuit 400 as sample/hold circuitry. As an illustrative example, consider the case in which circuit 400 has a parasitic capacitance of 169 fF (femto-Farads), of which parasitic wire capacitance (Cwire) is 100 fF. Further, it can be assumed that the circuit has a 0.5% mismatch in the signal capacitors C1 and C2, with each having a nominal value of 1200 fF. In Monte Carlo simulations of the circuit, the INL of a 12-bit ADC improves from 1.58 LSBs (with shielding coupled to ground) to 0.81 LSB with shielding coupled to node Y as described herein. Coupling the shielding to node Y provides a reduction in Gain Error arising from signal capacitor mismatch by a factor of approximately 1.8 using expression 1.

Referring to expression 3, the Gain Error is proportional to $\Delta Cpar/(C+Cpar)$. Since the design techniques disclosed within this specification reduce the parasitic wiring component of $\Delta Cpar$, the overall $\Delta Cpar$ is reduced. Conventional design techniques achieve a $\Delta Cpar$ of approximately 5 fF. Using the techniques disclosed within this specification, effective Cpar mismatch scales back the remaining mismatch of the parasitic capacitance in the differential pair so that $\Delta Cpar$ is effectively 1 fF.

Referring to the prior example, the wiring parasitic capacitance is scaled back from 100 fF to effectively 20 fF and from 105 fF to effectively 21 fF. Using expression 3 with the values in the conventional case in which the shielding is not connected to node Y, a Gain Error of 0.183% is achieved. The Gain Error does not meet the requirements for a 12-bit ADC stage and is unacceptable.

Using expression 3 with the improved values achieved by connecting the shielding to node Y, a Gain Error of 0.036% is achieved. The Gain Error in this case exceeds the requirements for a 12-bit ADC stage and represents an improvement of a factor of 5 over the previous example. In simulation results, a 5 fF parasitic imbalance causes approximately a 2 LSBs INL error when the shielding is coupled to ground. By coupling the shielding to node Y, however, INL is substantially reduced and nearly eliminated.

Figure 8:
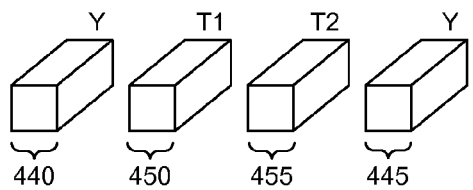
FIG. 8 is a cross-sectional side view of a differential input signal and shielding as illustrated in FIG. 4.

FIG. 8 is a cross-sectional side view of a differential input signal and shielding as illustrated in FIG. 4. As pictured, the first portion 440 and the second portion 446 of shielding 435 are coupled to node Y of the differential amplifier (not shown). Input line 450 is connected to input terminal T1, e.g., in the hold phase. Similarly, input line 455 is connected to input terminal T2, e.g., in the hold phase.

Figure 9:
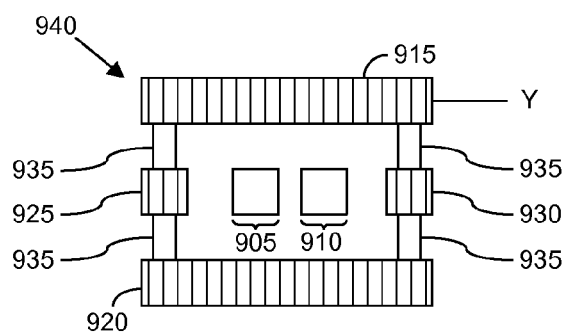
FIG. 9 is a cross-sectional side view of another example of a shielding configuration in which the shielding is connected to an internal node of an amplifier.

FIG. 9 is a cross-sectional side view of another example of a shielding configuration in which the shielding is connected to an internal node of an amplifier. As illustrated, input lines 905 and 910, forming a differential input pair, are enclosed by shielding 940. Input lines 905 and 910 can be coupled to a differential input stage of an amplifier as described within this specification.

Shielding 940 is formed of a conductive element 915 and a conductive element 920. As illustrated, each of conductive elements 915 and 920 can be formed with a width that is wider than each of input lines 905 and 910. Vias 935 connect conductive element 915 with conductive element 925 and conductive element 925 with conductive element 920. Similarly, vias 935 connect conductive element 915 with conductive element 930 and conductive element 930 with conductive element 920.

As pictured in FIG. 9, shielding 940 is connected to a node Y of the differential input stage of the amplifier to which signal lines 905 and 910 are connected. More particularly, node Y is a common source node of the differential input stage of the amplifier.

Figure 10:
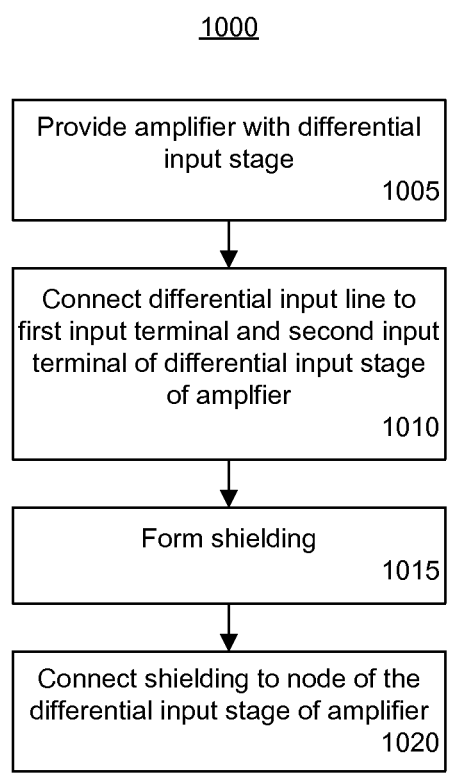
FIG. 10 is a flow chart illustrating an exemplary method of removing systematic parasitic mismatch at the input of an amplifier.

FIG. 10 is a flow chart illustrating an exemplary method 1000 of removing systematic parasitic mismatch at the input of an amplifier. Method 1000 can begin in block 1005 where an amplifier is provided that includes a differential input stage. The differential input stage includes a first input terminal and a second input terminal. In block 1010, a differential input line is connected to the first input terminal and the second input terminal. In block 1015, shielding is formed. The shielding at least partially encompasses the differential input line. In block 1020, the shield is connected to a node of the differential input stage of the amplifier.

The various circuit structures described within this specification have been provided for purposes of illustration only. It should be appreciated that the particular type of shielding and the manner in which the shielding is implemented within an IC is not intended to be limited to those examples provided. Any of a variety of different shielding techniques and/or structures for a differential input signal can be connected to a common source node of a differential input stage of an amplifier as described within this specification.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "connected" means that the elements that are connected are physically coupled to one another.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal" and "wire" may be used interchangeably, from time-to-time, within this specification.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A circuit, comprising:
   an amplifier comprising a differential input stage including a first input terminal and a second input terminal;
   a differential input line coupled to the first input terminal and the second input terminal; and
   shielding at least partially encompassing the differential input line;
   wherein the shielding is connected to a node of the differential input stage of the amplifier;
   the differential input stage comprises:
   a first transistor having a source, a drain, and a gate;
   a second transistor having a source, a drain, and a gate; and
   wherein the source of the first transistor is connected to the source of the second transistor forming the node.

2. The circuit of claim 1, wherein the differential input stage includes an input differential metal-oxide semiconductor field-effect transistor (MOSFET) pair.

3. The circuit of claim 1, wherein the node is a common source node.

4. The circuit of claim 1, wherein:
   the gate of the first transistor is connected to the first input terminal; and
   the gate of the second transistor is connected to the second input terminal.

5. The circuit of claim 1, wherein the amplifier is part of a switched capacitor circuit.

6. The circuit of claim 1, wherein the amplifier is part of a data converter circuit.

7. The circuit of claim 6, wherein the shield is located on each side of the differential input line.

8. The circuit of claim 7, wherein the shielding is formed of at least two conductive elements.

9. The circuit of claim 1, wherein the differential input line and the shielding are substantially parallel.

10. The circuit of claim 9, wherein the differential input line and the shielding are substantially perpendicular to process layers of an integrated circuit manufacturing process used to implement the circuit.

11. The circuit of claim 1, wherein:
    the first input terminal is connected to a first capacitor by a first input line of the differential input line; and
    the second input terminal is connected to a second capacitor by a second input line of the differential input line.

12. A method, comprising:
    providing an amplifier comprising a differential input stage including a first input terminal and a second input terminal;
    connecting a differential input line to the first input terminal and the second input terminal;
    forming shielding at least partially encompassing the differential input line; and
    connecting the shielding to a node of the differential input stage of the amplifier
    wherein the differential input stage comprises:
    a first transistor having a source, a drain, and a gate; and
    a second transistor having a source, a drain, and a gate;
    wherein the source of the first transistor is connected to the source of the second transistor forming the node.

13. The method of claim 12, wherein the differential input stage includes an input differential metal-oxide semiconductor field-effect transistor (MOSFET) pair.

14. The method of claim 12, wherein the node is a common source node.

15. The method of claim 12, wherein:
    the gate of the first transistor is coupled to the first input terminal; and
    the gate of the second transistor is coupled to the second input terminal.

16. The method of claim 12, wherein the differential input line and the shielding are substantially parallel.

17. The method of claim 16, wherein the differential input line and the shielding are substantially perpendicular to process layers of an integrated circuit manufacturing process used to implement the circuit.

18. The method of claim 12, wherein the shielding is formed of at least two conductive elements.

* * * * *